United States Patent
Korony

(10) Patent No.: US 10,673,110 B2
(45) Date of Patent: Jun. 2, 2020

(54) TRANSMISSION LINE BIAS RESISTOR

(71) Applicant: AVX Corporation, Fountain Inn, SC (US)

(72) Inventor: George Korony, Myrtle Beach, SC (US)

(73) Assignee: AVX Corporation, Fountain Inn, SC (US)

( * ) Notice: Subject to any disclaimer, the term of this patent is extended or adjusted under 35 U.S.C. 154(b) by 0 days.

(21) Appl. No.: 16/049,889

(22) Filed: Jul. 31, 2018

(65) Prior Publication Data

US 2019/0044212 A1    Feb. 7, 2019

Related U.S. Application Data

(60) Provisional application No. 62/540,366, filed on Aug. 2, 2017.

(51) Int. Cl.

| | |
|---|---|
| *H01P 1/20* | (2006.01) |
| *H01P 5/16* | (2006.01) |
| *H03H 7/06* | (2006.01) |
| *H01P 3/08* | (2006.01) |
| *H01L 23/66* | (2006.01) |
| *H03H 1/02* | (2006.01) |

(Continued)

(52) U.S. Cl.
CPC ............ *H01P 1/2007* (2013.01); *H01L 23/66* (2013.01); *H01P 3/08* (2013.01); *H01P 5/16* (2013.01); *H03H 1/02* (2013.01); *H03H 7/06* (2013.01); *H01L 2223/6627* (2013.01); *H01L 2223/6672* (2013.01); *H05K 1/025* (2013.01); *H05K 1/181* (2013.01); *H05K 2201/10015* (2013.01); *H05K 2201/10022* (2013.01)

(58) Field of Classification Search
CPC . H01P 1/2007; H01P 5/16; H01P 3/08; H03H 7/06
USPC ................................. 333/172, 204, 205, 238
See application file for complete search history.

(56) References Cited

U.S. PATENT DOCUMENTS 6,717,491 B2 * 4/2004 Liang .................. H01P 1/20372
                                                    333/205
6,898,070 B2   5/2005 Korony et al.
(Continued)

FOREIGN PATENT DOCUMENTS

KR    10-2011-0008871    1/2011

OTHER PUBLICATIONS

Rosu, "Microstrip, Stripline, and CPW Design," YO3DAC / VA3IUL, http://www.qsl.net/va3iul, Nov. 24, 2016—27 pages.
(Continued)

*Primary Examiner* — Rakesh B Patel
(74) *Attorney, Agent, or Firm* — Dority & Manning, P.A.

(57) ABSTRACT

Systems and methods for introducing DC bias in a radio frequency (RF) signal communicated over a transmission line are provided. In one example implementation, the RF system can include a transmission line having a first port and a second port. The transmission line can be configured to communicate an RF signal between a first port and a second port. One or more DC bias resistors can be coupled to the transmission line at a location between the first port and the second port. Each DC bias resistor can provide a path for injecting DC current to the transmission line to provide DC bias for the RF signal. Each DC bias resistor can be coupled to the transmission line via a point connection.

18 Claims, 5 Drawing Sheets

(51) Int. Cl.
 *H05K 1/02* (2006.01)
 *H05K 1/18* (2006.01)

(56) References Cited

U.S. PATENT DOCUMENTS

| | | | |
|---|---|---|---|
| 2003/0011442 A1 | 1/2003 | Ashoka | |
| 2003/0146809 A1 | 8/2003 | Buber et al. | |
| 2004/0257168 A1 | 12/2004 | Al-Taei et al. | |
| 2008/0212250 A1* | 9/2008 | Huang | H01R 13/6666 361/111 |
| 2015/0108607 A1* | 4/2015 | Chen | H01L 28/60 257/533 |

OTHER PUBLICATIONS

Andrews Ph.D., "Broadband Coaxial Bias Tees," Picosecond Pulse Labs, Nov. 2000—3 pages.
PCT International Search Report and Written Opinion for corresponding PCT Application No. PCT/US2018/044480, dated Nov. 8, 2018, 10 pages.

* cited by examiner

TRANSMISSION LINE BIAS RESISTOR

PRIORITY CLAIM

The present application claims the benefit of priority of U.S. Provisional Patent Application Ser. No. 62/540,366, titled "Transmission Line Bias Resistor," filed on Aug. 2, 2017, which is incorporated herein by reference.

BACKGROUND

Transmission lines can be used to communicate RF signals among components in an RF system. For instance, transmission lines (e.g., traces) can be provided on printed circuit boards to communicate RF signals to various devices. In some circumstances, it can be desirable to add DC bias across a wide frequency range to an RF signal transmitted along a transmission line. Conical inductors have been used to inject DC current into transmission lines for higher frequency applications.

SUMMARY

One example aspect of the present disclosure is directed to a radio frequency (RF) system. The RF system can include a transmission line configured to communicate an RF signal between a first port and a second port. One or more DC bias resistors can be coupled to the transmission line at a location between the first port and the second port. Each DC bias resistor can provide a path for injecting DC current to the transmission line to provide DC bias for the RF signal. Each DC bias resistor can be coupled to the transmission line via a point connection.

Other features and aspects of the present disclosure are set forth in greater detail below.

BRIEF DESCRIPTION OF THE DRAWINGS

A full and enabling disclosure of the present disclosure, including the best mode thereof, directed to one of ordinary skill in the art, is set forth more particularly in the remainder of the specification, which makes reference to the appended figure in which.

DETAILED DESCRIPTION OF REPRESENTATIVE EMBODIMENTS

Figure 1:
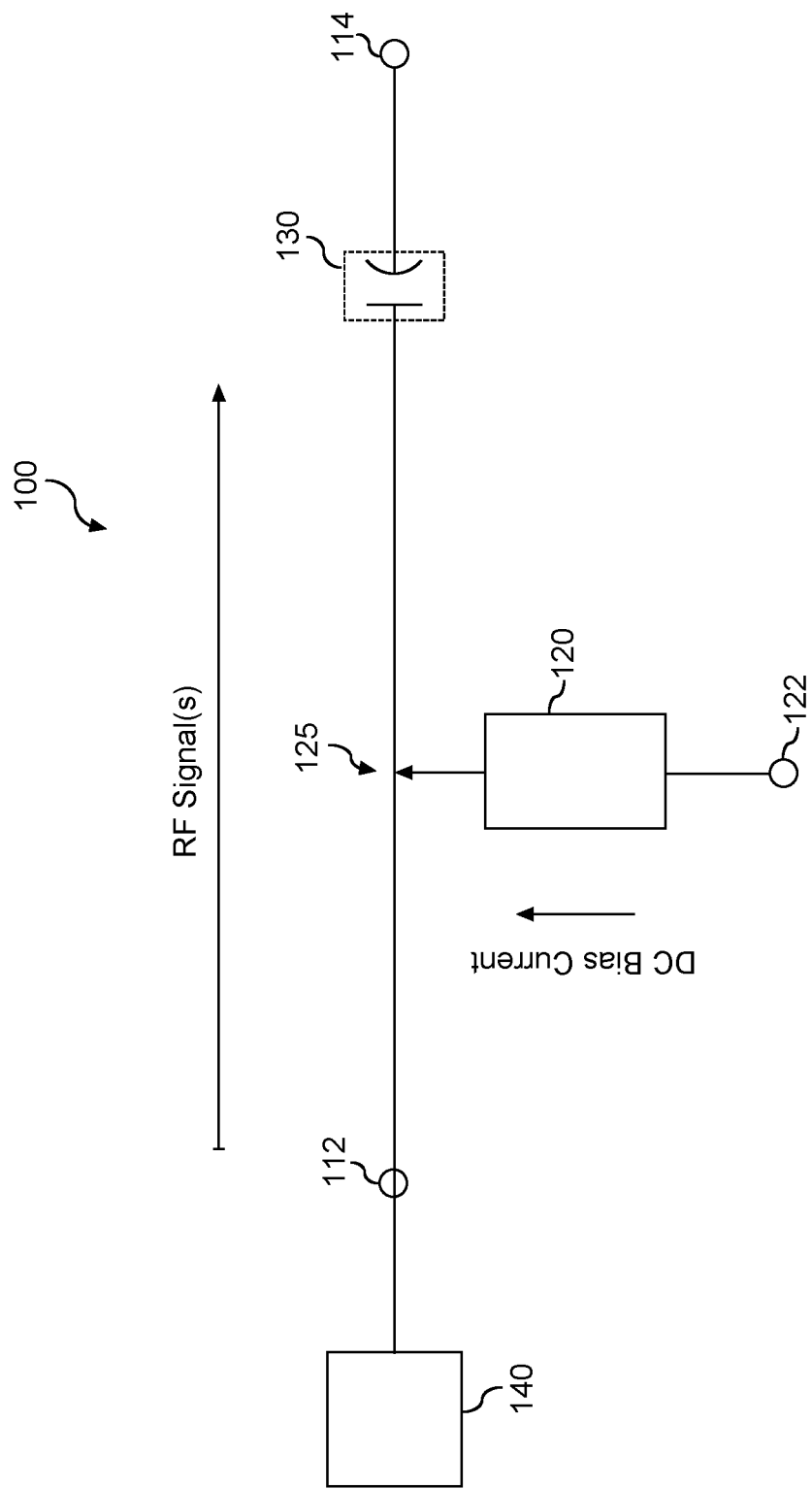
FIG. 1 depicts a circuit diagram of an example RF system according to example embodiments of the present disclosure.

It is to be understood by one of ordinary skill in the art that the present discussion is a description of exemplary embodiments only, and is not intended as limiting the broader aspects of the present disclosure, which broader aspects are embodied in the exemplary construction.

Example aspects of the present disclosure are directed to systems and methods for injecting DC bias current in an RF signal communicated over a transmission line. For instance, an RF system can include a transmission line configured to communicate an RF signal between a first port and a second port. One or more DC bias resistors can be coupled to the transmission line at a location between the first port and the second port. Each of the one or more DC bias resistors can provide a path for the injection of DC current into the RF signal to provide DC bias.

According to example aspects of the present disclosure, each of the one or more DC bias resistors can be coupled to the transmission line (e.g., at a location between the first port and the second port) using a small point connection. A point connection refers to a connection having a small point of contact with the transmission line relative to a size of the transmission line and the DC bias resistor. For instance, in some embodiments, a point connection can have a length (e.g., the length of contact with the transmission line) that is less than about 5% of a length of the transmission line, such as less than about 2% of the length of the transmission line, such as less than about 1% of the length of the transmission line, such as less than about 0.5% of the length of the transmission line. As used herein, the use of the term "about" in conjunction with a numerical value is intended to refer to within 20% of the numerical value.

By using a small point connection, DC bias current can be injected via a DC bias resistor into RF signals over a wide frequency range (e.g., about 500 MHz to about 40 GHz) with reduced impact on performance parameters (e.g., insertion loss). In this way, DC bias current can be provided in RF signals communicated over a transmission line to active devices in an RF system, such as high frequency transistors, optical transducers, laser diodes, application specific integrated circuits (ASICs), or other devices coupled to the transmission line.

In some embodiments, the DC bias resistor can be coupled to the transmission line using a tip contact. The tip contact can form a part of the DC bias resistor or can be a separate structure coupled between the DC bias resistor and the transmission line. The tip contact can have a shape adapted to provide a point connection between the DC bias resistor and the transmission line. For example, the tip contact can be tapered such that a narrow portion of the tip contact is coupled to the transmission line. In some embodiments, the tip contact can have a triangular shape. A point of the triangular shape can be coupled to the transmission line. The tip contact can have other suitable shapes adapted to provide a point connection without deviating from the scope of the present disclosure.

In some embodiments, a first DC bias resistor can be coupled to a transmission line via a first tip contact. A second DC bias resistor can be coupled to the transmission line via a second tip contact. Each of the first tip contact and the second tip contact can provide a point connection with the transmission line. In some implementations, the first DC bias resistor and second DC bias resistor can mirror one another about the transmission line. This can provide better symmetry for the RF system when implemented, for instance, using a surface mount device.

In example embodiments, an RF system according to example embodiments of the present disclosure can be implemented in a surface mount device configured to be mounted to a substrate, such as a printed circuit board. For instance, a multiport surface mount device can include a transmission line for communicating RF signals between a first port and a second port. The transmission line can be implemented as a conductive trace provided on a suitable dielectric substrate, such as aluminum nitride, alumina, or other material. The transmission line can have a size suitable for communicating RF signals associated with a wide range of frequencies, such as between about 500 MHz and about 40 GHz. In some embodiments, the transmission line can be implemented in the surface mount device above a ground plane.

A first contact pad can be coupled to a first end of the transmission line to provide a first port. A second contact pad can be coupled to a second end of the transmission line to provide a second port. The contact pads can be made of a suitable conductive material, such as copper or other conductive material A thin film DC bias resistor can be coupled to the transmission line via a tip contact according to example embodiments of the present disclosure. The thin film DC bias resistor can be coupled to the transmission line via the tip contact at a location between the first port and the second port. The thin film bias resistor can provide a path for injection of a DC bias current into an RF signal communicated over the transmission line. In some embodiments, the thin film resistors can be made from a CrSi material or other suitable material. In some embodiments, the thin film resistor can have a value of about 1 kOhms.

In example embodiments, a first thin film DC bias resistor can be coupled to the transmission line via a first tip connection. A second thing film DC bias resistor can be coupled to the transmission line via a second tip connection. The surface mount device can include a third contact pad coupled to the first thin film DC bias resistor. The surface mount device can include a fourth contact pad coupled to the second thin film DC bias resistor.

The surface mount devices according to example embodiments of the present disclosure (e.g., contact pads of the surface mount device) can be electrically coupled to other components on a substrate, such as a printed circuit board using any suitable connection. For instance, the surface mount device can include a ball grid array (BGA) connection or other suitable connection.

Example embodiments are provided below for purposed of illustration and discussion. One example embodiment of the present disclosure is directed to a radio frequency (RF) system. The RF system includes a transmission line configured to communicate an RF signal (e.g., associated with a frequency between about 500 MHz to about 40 GHz) between a first port and a second port. The RF system includes one or more DC bias resistors coupled to the transmission line at a location between the first port and the second port. Each DC bias resistor provides a path for injecting DC current to the transmission line to provide DC bias for the RF signal. Each DC bias resistor can be coupled to the transmission line using a point connection.

Variations and modifications can be made to this example embodiment of the present disclosure. For instance, in some embodiments, the point connection can have length that is less than about 5% of a length of the transmission line, such as less than about 2%, such as less than about 1%, such as less than about 0.5%. In some embodiments, the RF system can include a DC blocking capacitor coupled to the transmission line.

In some embodiments, the point connection can be implemented using a tip contact. The tip contact can be tapered. In some examples, the tip contact can have a triangular shape. A point of the triangular shape can be coupled to the transmission line. In some embodiments, the tip contact forms a part of the DC bias resistor. In some embodiments, the tip contact is a structure coupled between the DC bias resistor and the transmission line.

In some embodiments, the one or more DC bias resistors can include a first DC bias resistor coupled to the transmission line via a first tip contact and a second DC bias resistor coupled to the transmission line via a second tip contact. The first DC bias resistor and first tip contact and the second DC bias resistor and the second tip contact can mirror one another about the transmission line.

In some embodiments, the first port can be coupled to an active device. The active device can include, for instance, a transistor, ASIC, optical transducer, laser diode, etc.

Another example embodiment of the present disclosure is directed to a surface mount device. The surface mount device can include a planar transmission line having a first end and a second end. The transmission line can be provided, for instance, on a dielectric substrate. The surface mount device can include a thin film DC bias resistor (e.g., comprising a CrSi material) coupled to the planar transmission line via a tip contact (e.g., a tapered tip contact) at a location between the first end and the second end. A first contact pad can be coupled to the first end of the planar transmission line. A second contact pad can be coupled to the second end of the planar transmission line. A third contact pad can be coupled to the thin film DC bias resistor.

Variations and modifications can be made to this example embodiment of the present disclosure. For instance, in some embodiments, the tip contact is coupled to the planar transmission line via a point connection having a length that is less than about 5% of a length of the transmission line, such as less than about 2% of a length of the transmission line, such as less than about 1% of a length of the transmission line, such as less than about 0.5% of a length of the transmission line.

In some embodiments, the surface mount device can include a second thin film DC bias resistor coupled to the planar transmission line via a second tip contact. A fourth contact pad can be coupled to the second thin film DC bias resistor.

Yet another example embodiment of the present disclosure is directed to a method of providing DC bias in a transmission line. The method includes communicating an RF signal (e.g., associated with a frequency between about 500 MHz and about 40 GHz) from a first port of a planar transmission line to a second port of the planar transmission line. The planar transmission line can be provided on a dielectric substrate. The method can include injecting a DC current bias to the RF signal via thin film DC bias resistor. The DC bias resistor can be coupled to the transmission line at a location between the first port and the second port using a tip contact providing a point connection to the transmission line. Variations and modification can be made to this example embodiment of the present disclosure.

The figures are provided for purposes of illustration and discussion of example embodiments of the present disclosure. FIG. 1 depicts a diagram of an example RF system 100 according to example embodiments of the present disclosure. The system 100 includes a transmission line 110 configured to communicate RF signals between a first port 112 and a second port 114. The RF signals can be associated with a wide range of frequencies. For instance, in example embodiments, the RF signals can be associated with a frequency or a frequency band in the in the range of about 500 MHz to about 40 GHz.

An active device 140 can be coupled to the first port 112. The active device 140 can be any suitable device that operates and/or receives based at least in part on RF signals communicated over the transmission line. In example embodiments, the active device can be, for instance, high frequency transistor(s), ASIC(s), optical device(s), or other devices.

A DC bias resistor 120 can be coupled to the transmission line 110 at a location between the first port 112 and the second port 114. The DC bias resistor 120 can be, for instance, a thin film resistor. The DC bias resistor 120 can provide a path for injection of DC current into the RF signal(s) communicated over the transmission line 110. The DC bias current can be provided from, for instance a third port 122. The DC bias resistor 120 can be coupled to the transmission line 110 using a point connection 125. Example point connections will be discussed in detail below.

Optionally, the RF system 100 can include a DC blocking capacitor 130. The DC blocking capacitor 130 can block DC bias components injected in the RF signal by way of the DC bias resistor 120. In these example embodiments, the first port 112 can provide an RF signal with DC bias, the second port 114 can provide an RF signal with no DC bias, and the third port 122 can provide the DC current for implementing the DC bias in the RF signal.

Figure 2:
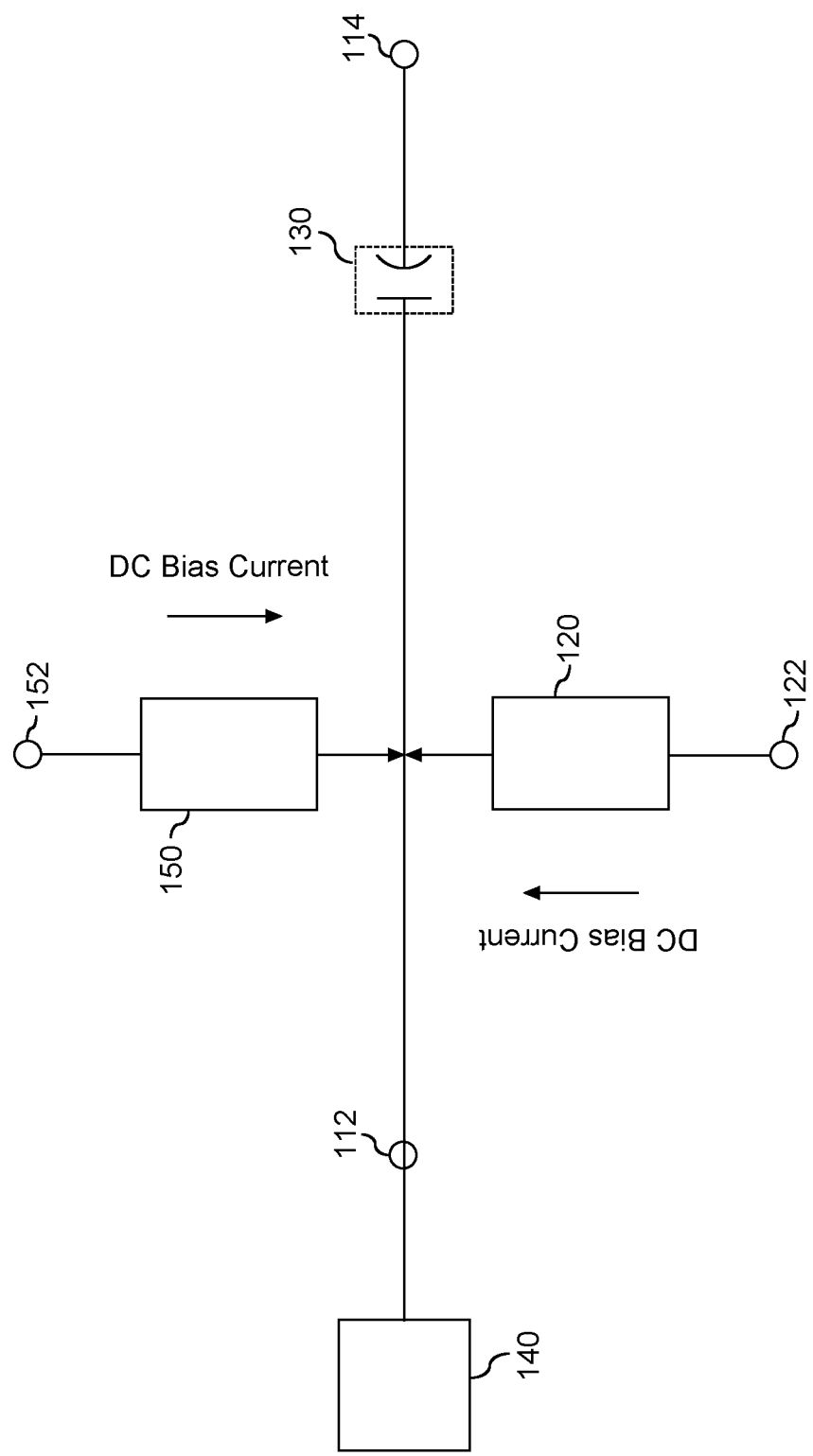
FIG. 2 depicts an example RF system according to example embodiments of the present disclosure.

FIG. 2 depicts an RF system 100 according to another example embodiment of the present disclosure. The RF system 100 of FIG. 2 is similar to that of FIG. 1, except that the RF system 100 additionally includes a second DC bias resistor 150 coupled to the transmission line 110 at a location between the first port 112 and the second port 114. The second DC bias resistor 150 can be, for instance, a thin film resistor. The second DC bias resistor 150 can provide a path for injection of DC current into the RF signal(s) communicated over the transmission line 110. The DC bias current can be provided from, for instance a fourth port 152. The DC bias resistor 120 can be coupled to the transmission line 110 using a point connection 125. Example point connections will be discussed in detail below.

In example embodiment of FIG. 2, the first port 112 can provide an RF signal with DC bias. The second port 114 can provide an RF signal with no DC bias. The third port 122 can provide the DC current for implementing at least a part of the DC bias in the RF signal, and the fourth port 152 can provide the DC current for implementing at least a part of the DC bias in the RF signal.

FIG. 2 depicts two DC bias resistors coupled to the transmission line 110 for purposes of illustration and discussion. Those of ordinary skill in the art, using the disclosures provided herein, will understand that more or fewer DC bias resistors can be coupled to the transmission line 110 without deviating from the scope of the present disclosure.

Figure 3:
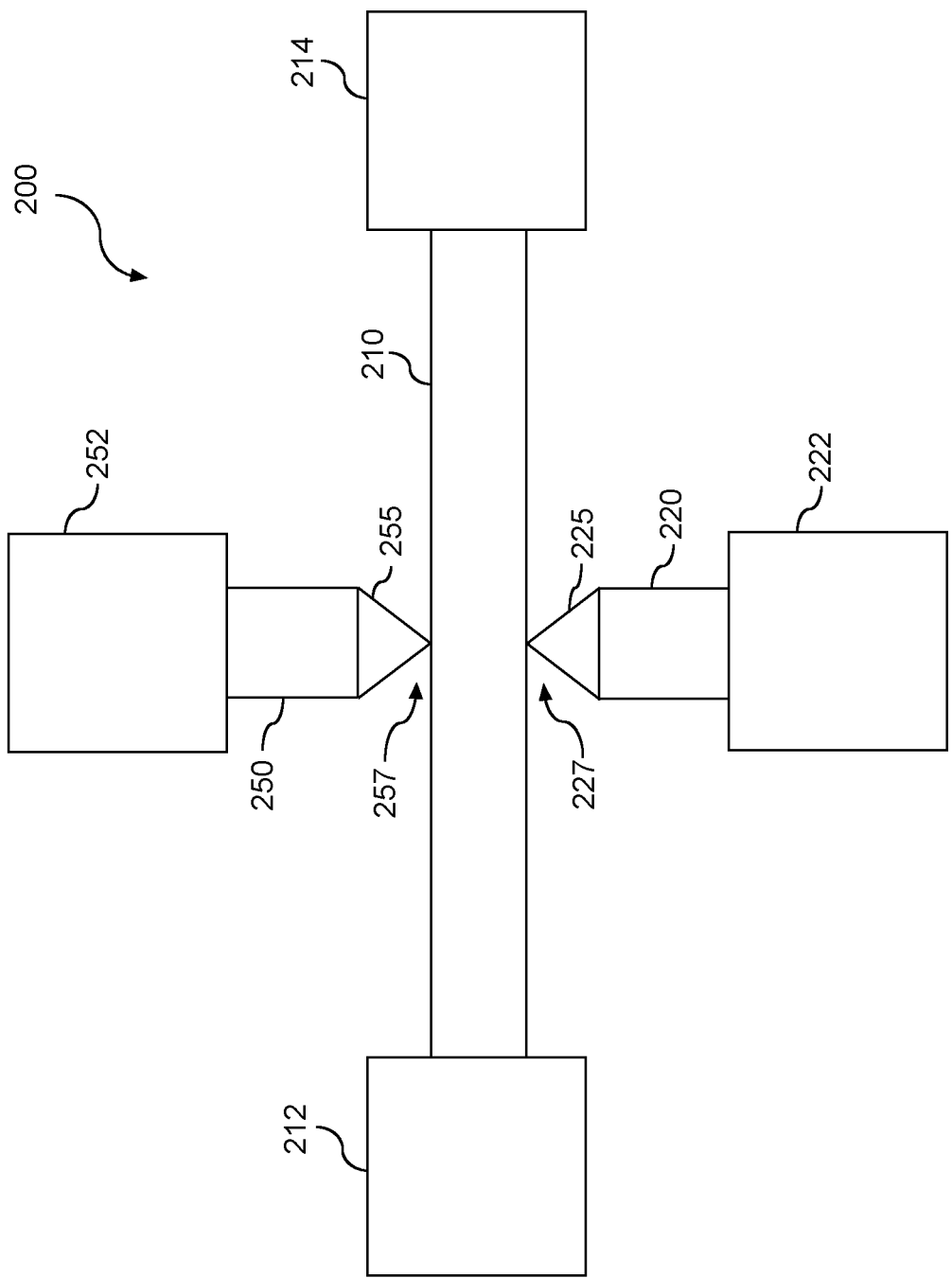
FIG. 3 depicts an example RF system implemented on a substrate according to example embodiments of the present disclosure.

FIG. 3 depicts a plan view of a portion of an example implementation of an RF system 200 that can be used, for instance, in a surface mount device. The system 200 includes a transmission line 210. The transmission line 210 can be implemented as a conductive trace on a dielectric substrate. The transmission line 210 can be coupled to a first conductive pad 212 at a first end of the transmission line 210. The transmission line 210 can be coupled to a second conductive pad 214 at a second end of the transmission line 210.

RF signals can be communicated over the transmission line 210. The first conductive pad 212 can act as or can be in communication with a first port of the RF system 200. The second conductive pad 214 can act as or can be in communication with a second port of the RF system. The transmission line 210 can communicate RF signals between the first port and the second port.

In some embodiments, the transmission line 210 is sized and dimensioned to accommodate RF signals over a variety of different frequency ranges. In some embodiments, the transmission line 210 is sized to accommodate RF signals in the range of about 500 MHz to about 40 GHz.

A first DC bias resistor 220 can be coupled to the transmission line 210 at a location between the first end and the second end of the transmission line 210 via a first tip contact 225. The first DC bias resistor 220 can provide a path for injection of DC current bias into an RF signal communicated over the transmission line 210. A third contact pad 252 can be coupled to the transmission line 210. The third contact pad 252 can act as and/or can be in communication with a third port of the RF system 200.

The first tip contact 225 can provide a point connection 227 with the transmission line 210. The first tip contact 225 can form a part of the first DC bias resistor 220 or can be a separate structure from the first DC bias resistor 220. As shown, the first tip contact 225 is tapered such that a narrower portion of the first tip contact 225 is coupled to the transmission line. More particularly, the first tip contact 225 has a triangular shape. A point of the triangular shape is in contact with the transmission line 210.

A second DC bias resistor 250 can be coupled to the transmission line 210 at a location between the first end and the second end of the transmission line 210 via a second tip contact 255. The second DC bias resistor 220 can provide a path for injection of DC current bias into an RF signal communicated over the transmission line 210. A fourth contact pad 252 can be coupled to the transmission line 210. The fourth contact pad 252 can act as and/or can be in communication with a fourth port of the RF system 200.

The second tip contact 255 can provide a point connection 257 with the transmission line 210. The second tip contact 255 can form a part of the second DC bias resistor 250 or can be a separate structure from the second DC bias resistor 250. As shown, the second tip contact 255 is tapered such that a narrower portion of the second tip contact 255 is coupled to the transmission line. More particularly, the first tip contact 255 has a triangular shape. A point of the triangular shape is in contact with the transmission line 210. As shown in FIG. 3, the first DC bias resistor 220 and the second DC bias resistor 250 mirror on another about the transmission line 210 to provide for improved symmetry.

Figure 4:
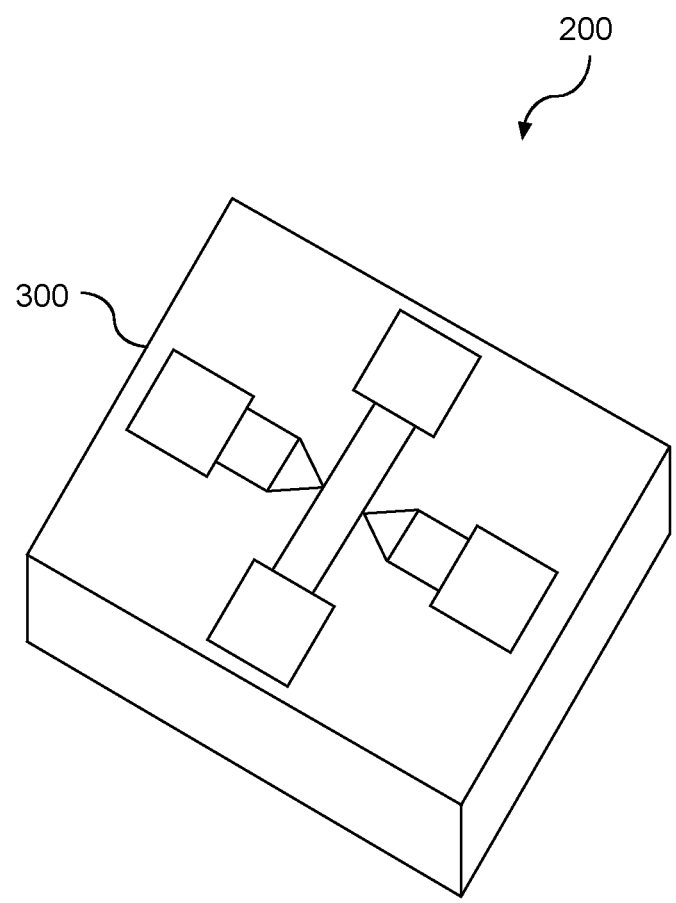
FIG. 4 depicts an example RF system implemented as part of a surface mount device according to example embodiments of the present disclosure.

FIG. 4 depicts a portion of an example implementation of the RF system 200 of FIG. 3 on a surface mount device 300 according to example embodiments of the present disclosure. The transmission line 210 can be implemented on a dielectric substrate. The dielectric substrate can be formed from, for instance, aluminum nitride, alumina, etc. The substrate can include terminals for connection to the contact pads 212, 214, 222, and 252. The terminals can be, for instance, copper terminals associated with a size of, for instance, 10 μm. The contact pads can have a size of about 0.2 mm×0.2 mm. The surface mount device can be configured for connection to, for instance, a printed circuit board, using a ball grid array. In some embodiments, the surface mount device can have a length of about 1.4 mm, a width of about 1.2 mm, and a height of about 0.5 mm.

Figure 5:
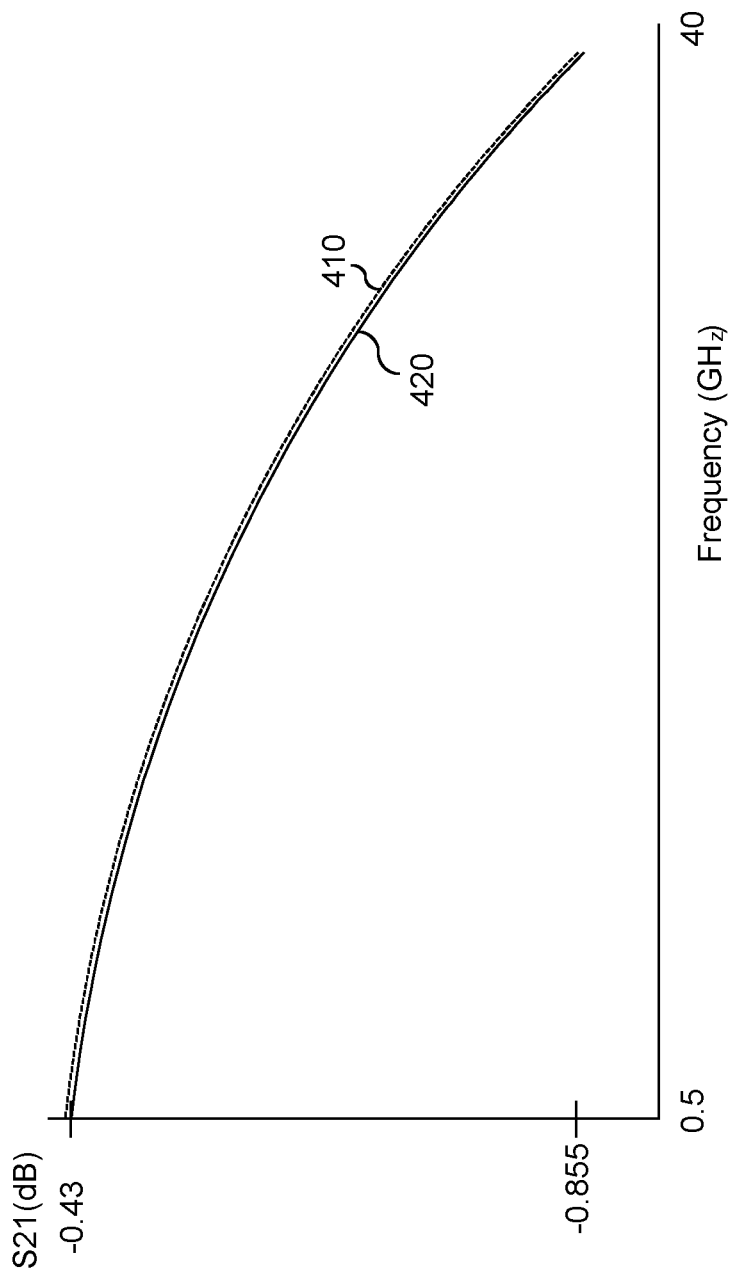
FIG. 5 depicts example simulated insertion loss for an example RF system according to example embodiments of the present disclosure; and Repeat use of reference characters in the present specification and drawing is intended to represent same or analogous features or elements of the disclosure.

FIG. 5 depicts example insertion loss parameters for an RF system 200 according to example embodiments of the present disclosure. FIG. 5 plots insertion loss (in dB) along the vertical axis and RF signal frequency along the horizontal axis. Curve 410 shows insertion loss with third and fourth ports grounded. Curve 420 shows insertion loss with third and fourth ports configured with DC bias resistors as shown in FIG. 3. As demonstrated, the inclusion of DC bias resistors for injection of DC bias current has little effect on insertion loss of the RF system across a wide frequency range (e.g., about 500 MHz to about 40 GHz).

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A radio frequency (RF) system, the RF system comprising:
    a transmission line configured to communicate an RF signal between a first port and a second port;
    one or more DC bias resistors coupled to the transmission line at a location between the first port and the second port, each DC bias resistor providing a path for injecting DC current to the transmission line to provide DC bias for the RF signal;
    wherein each DC bias resistor is coupled to the transmission line via a point connection; and
    wherein a length of the point connection of each DC bias resistor is less than about 5% of a length of the transmission line.

2. The RF system of claim 1, wherein the one or more DC bias resistors comprise a first DC bias resistor coupled to the transmission line via a first tip contact and a second DC bias resistor coupled to the transmission line via a second tip contact, wherein the first DC bias resistor and the first tip contact mirror the second DC bias resistor and the second tip contact about the transmission line.

3. The RF system of claim 1, wherein the point connection of each DC bias resistor is implemented using a tip contact.

4. The RF system of claim 3, wherein the tip contact of each point connection is tapered.

5. The RF system of claim 3, wherein the tip contact of each point connection has a triangular shape, wherein a point of the triangular shape is coupled to the transmission line.

6. The RF system of claim 3, wherein the tip contact of each point connection forms a part of the one or more DC bias resistors.

7. The RF system of claim 3, wherein the tip contact of each point connection is a structure coupled between the one or more DC bias resistors and the transmission line.

8. The RF system of claim 1, wherein the RF signal has a frequency in the range of about 500 MHz to about 40 GHz.

9. The RF system of claim 1, further comprising:
    a DC blocking capacitor coupled to the transmission line.

10. The RF system of claim 1, wherein the first port is coupled to an active device.

11. The RF system of claim 10, wherein the active device comprises a transistor, application specific integrated circuit, optical transducer, or laser diode.

12. A method of providing DC bias in a transmission line, the method comprising:
    communicating an RF signal from a first port of a planar transmission line to a second port of the planar transmission line, the planar transmission line provided on a dielectric substrate;
    injecting a DC current bias to the RF signal via a thin film DC bias resistor;
    wherein the thin film DC bias resistor is coupled to the transmission line at a location between the first port and the second port using a tip contact providing a point connection to the transmission line, and
    wherein a length of the point connection is less than about 5% of a length of the planar transmission line.

13. The method of claim 12, wherein the RF signal is associated with a frequency in the range of about 500 MHz to about 40 GHz.

14. A surface mount device, the surface mount device comprising:
    a planar transmission line having a first end and a second end,
    a thin film DC bias resistor coupled to the planar transmission line via a tip contact at a location between the first end and the second end;
    a first contact pad coupled to the first end of the planar transmission line;
    a second contact pad coupled to the second end of the planar transmission line; and
    a third contact pad coupled to the thin film DC bias resistor,
    wherein the tip contact is coupled to the planar transmission line via a point connection having a length that is less than about 5% of a length of the transmission line.

15. The surface mount device of claim 14, wherein the tip contact is tapered.

16. The surface mount device of claim 14, wherein the surface mount device comprises a second thin film DC bias resistor coupled to the planar transmission line via a second tip contact, wherein a fourth contact pad is coupled to the second thin film DC bias resistor.

17. The surface mount device of claim 14, wherein the DC bias resistor comprises a CrSi material.

18. The surface mount device of claim 14, wherein the planar transmission line is provided on a dielectric substrate.

* * * * *